(12) United States Patent
Pérez López et al.

(10) Patent No.: US 11,073,658 B2
(45) Date of Patent: Jul. 27, 2021

(54) PHOTONIC CHIP, FIELD PROGRAMMABLE PHOTONIC ARRAY AND PROGRAMMABLE CIRCUIT

(71) Applicant: UNIVERSITAT POLITÈCNICA DE VALÈNCIA, Valencia (ES)

(72) Inventors: Daniel Pérez López, Valencia (ES); José Capmany Francoy, Valencia (ES); Ivana Gasulla Mestre, Valencia (ES)

(73) Assignee: UNIVERSITAT POLITÈCNICA DE VALÈNCIA, Valencia (ES)

( * ) Notice: Subject to any disclaimer, the term of this patent is extended or adjusted under 35 U.S.C. 154(b) by 0 days.

(21) Appl. No.: 16/235,056

(22) Filed: Dec. 28, 2018

(65) Prior Publication Data

US 2020/0209473 A1 Jul. 2, 2020

(51) Int. Cl.
*G02B 6/12* (2006.01)
*G02B 6/28* (2006.01)
*G02B 6/293* (2006.01)

(52) U.S. Cl.
CPC ..... *G02B 6/12004* (2013.01); *G02B 6/12007* (2013.01); *G02B 2006/12147* (2013.01); *G02B 2006/12159* (2013.01); *G02B 2006/12164* (2013.01)

(58) Field of Classification Search
CPC ............ G02B 6/12004; G02B 6/12007; G02B 2006/12159; G02B 2006/12147; G02B 2006/12164
See application file for complete search history.

(56) References Cited

U.S. PATENT DOCUMENTS

| | | | |
|---|---|---|---|
| 8,019,185 B2 * | 9/2011 | Yap | G02B 6/12007 385/1 |
| 9,354,039 B2 * | 5/2016 | Mower | B82Y 20/00 |
| 2017/0351293 A1 * | 12/2017 | Carolan | G06E 3/008 |

* cited by examiner

*Primary Examiner* — Ryan A Lepisto
(74) *Attorney, Agent, or Firm* — Hayes Soloway PC

(57) ABSTRACT

The present invention relates to a photonic chip realized by combining at least one Programmable Photonics Analog Block (PPAB) and at least one Reconfigurable Photonic Interconnection (RPI) implemented over a photonic chip that is capable of implementing one or various simultaneous photonics circuits and/or linear multipart transformations by the appropriate programming of its resources (i.e. PPABs and RPIs) and the selection of its input and output ports. The invention also relates to a field-programmable photonic array (FPPA) comprising at least a programmable circuit based on tunable beamsplitters with independent coupling and phase-sifting configuration and peripheral high-performance building blocks.

19 Claims, 13 Drawing Sheets

PPAB TYPES

PPAB Type A    PPAB Type B    PPAB Type C    PPAB Type D

PPAB TYPE A OPERATION CODE COLOUR

Arbitrary phase bar switch

Left-up to right-down

$$\begin{pmatrix} b_3 \\ b_4 \end{pmatrix} = e^{j\Delta_{PPAB}} = \begin{pmatrix} 1 & 0 \\ 0 & 1 \end{pmatrix} \begin{pmatrix} b_1 \\ b_2 \end{pmatrix}$$

Right-down to left-up

$$\begin{pmatrix} b_1 \\ b_2 \end{pmatrix} = e^{j\Delta_{PPAB}} = \begin{pmatrix} 1 & 0 \\ 0 & 1 \end{pmatrix} \begin{pmatrix} b_3 \\ b_4 \end{pmatrix}$$

PPAB TYPE A OPERATION CODE COLOUR

Arbitrary phase cross switch

Left-up to right-down

$$\begin{pmatrix} b_3 \\ b_4 \end{pmatrix} = e^{j\Delta_{PPAB}} = \begin{pmatrix} 0 & j \\ j & 0 \end{pmatrix} \begin{pmatrix} b_1 \\ b_2 \end{pmatrix}$$

Right-down to left-up

$$\begin{pmatrix} b_1 \\ b_2 \end{pmatrix} = e^{j\Delta_{PPAB}} = \begin{pmatrix} 0 & j \\ j & 0 \end{pmatrix} \begin{pmatrix} b_3 \\ b_4 \end{pmatrix}$$

PPAB TYPE A OPERATION CODE COLOUR

Variable Coupler

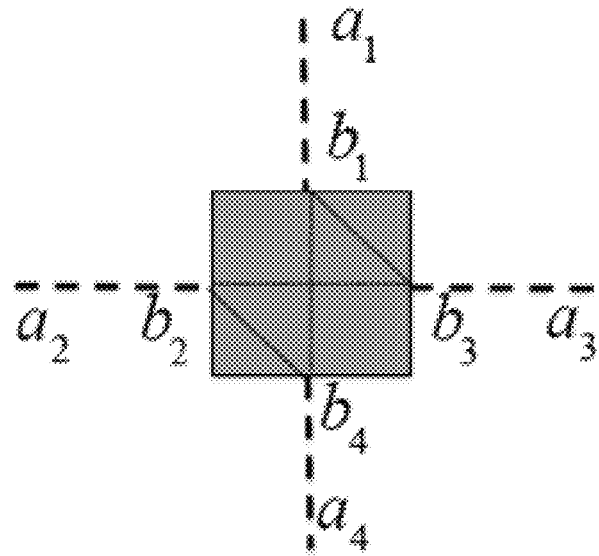

Left-up to right-down

$$\begin{pmatrix} b_3 \\ b_4 \end{pmatrix} = e^{j\Delta_{PPAB}} = \begin{pmatrix} \sqrt{1-K} & j\sqrt{K} \\ j\sqrt{K} & \sqrt{1-K} \end{pmatrix} \begin{pmatrix} b_1 \\ b_2 \end{pmatrix}$$

Right-down to left-up

$$\begin{pmatrix} b_1 \\ b_2 \end{pmatrix} = e^{j\Delta_{PPAB}} = \begin{pmatrix} \sqrt{1-K} & j\sqrt{K} \\ j\sqrt{K} & \sqrt{1-K} \end{pmatrix} \begin{pmatrix} b_3 \\ b_4 \end{pmatrix}$$

Figure 4 (cont.)

COMBINED ACCESS RPI + PRECEEDING PPAB OPERATION

COMBINED ACCESS RPI + SUCCEEDING PPAB OPERATION

PHOTONIC CHIP, FIELD PROGRAMMABLE PHOTONIC ARRAY AND PROGRAMMABLE CIRCUIT

OBJECT OF THE INVENTION

The present invention relates to a photonic chip realized by combining at least one Programmable Photonics Analog Block (PPAB) and at least one Reconfigurable Photonic Interconnection (RPI), which is capable of implementing one or various simultaneous photonics circuits and/or linear multiport transformations by the appropriate programming of its resources (i.e. PPABs and RPIs) as well as the selection of its input and output ports and combined with optional high-performance peripheral building blocks.

BACKGROUND OF THE INVENTION

Programmable multifunctional photonics (PMP) seeks to design common configurations of integrated optical hardware that can implement a wide variety of functionalities by means of suitable programming. Various authors have covered theoretical works proposing different configurations and design principles for programmable circuits based on cascade beam splitters or Mach-Zehnder interferometers (MZIs). These proposals offer versatile hardware solutions to implement programmable circuits, but none of them defines a complete architectonic solution for a photonic device that can be programmed to implement simple, complex or even simultaneous arbitrary circuits.

DESCRIPTION OF THE INVENTION

The object of the invention described here solves the problems set out above and allows functionalities to be provided by a single and general hardware platform, similarly to an electronic field-programmable analogue gate array.

The object of the invention is based on the replication and interconnection of units of programmable photonic analogue blocks (PPAB) and units of reconfigurable photonic interconnections (RPI) preferably implemented via a photonic chip. The PPABs provide the basic components to implement basic optical analogue operations (reconfigurable optical power/energy division and independent phase shifting). In a very broad sense, it can be considered that the reconfigurable processing in the same manner as the programmable logical blocks (PLB) carry out digital operations in electronic FPGAs or configurable analogue blocks (CBAs), which carry out analogue operations in electronic field-programmable analogue arrays (FPAA); the interconnections being reconfigurable between the PPAB provided by the RPI. Therefore, and in view of the foregoing, it can be observed that the object of the invention allows one or various simultaneous photonic circuits and/or linear multiport transformations by means of suitable programming of their resources, that is to say the corresponding PPAB and RPI and the selection of their input and output ports.

The object of the invention is described in the set of claims, hereby included by reference.

The proposed photonic chip, field-programmable photonic array (FPPA) of the present invention brings a series of advantages inherent to field programmable hardware approaches. These include:

Shorter times for production and to market.
Lower prototype development and non-recurring engineering costs.
Reduced financial risk in developing ideas and translating them into ASPICs.
Multifunctional and multitask operation.
Circuit optimization.

The proposed photonic chip, field-programmable photonic array (FPPA) of the present invention is suitable for the following applications:

Aerospace and Defense (Avionics, Communications, Secure Solutions, Space)
Automotive (High Resolution Video, Image Processing Vehicle Networking and Connectivity, Automotive Infotainment)
Data Centers (Servers, Routers, Switches, Gateways)
High Performance Computing (Servers, Super Computers, SIGINT Systems, High-end RADARs, High-end Beam Forming Systems, Quantum computing, High-speed neural networks)
Integrated Circuit Design (ASPIC Prototyping, Hardware Emulation)
Wired and Wireless Communications (Optical Transport Networks, Network Processing 5G Connectivity Interfaces, Mobile Backhaul)
Hardware accelerators.
Machine and Deep learning applications.

DESCRIPTION OF THE DRAWINGS

In order to complement the description being made and with the object of helping to better understand the characteristics of the invention, in accordance with a preferred practical embodiment thereof, said description is accompanied, as an integral part thereof, by a set of figures where, in an illustrative and non-limiting manner, the following has been represented.

PREFERRED EMBODIMENT OF THE INVENTION

Figure 1:
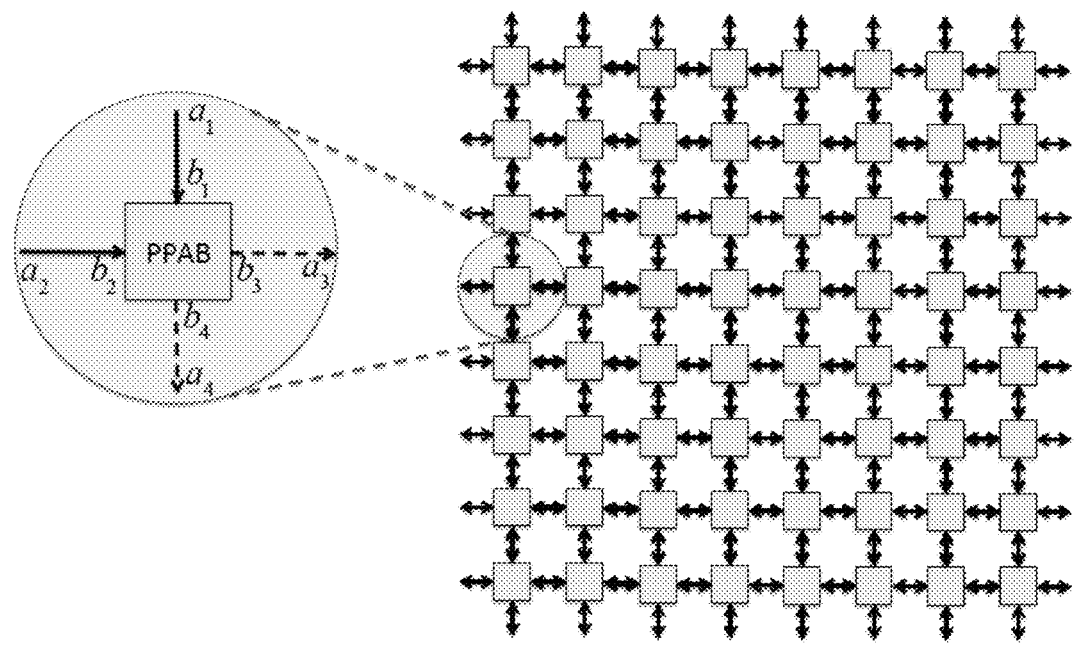
FIG. 1 shows a schematic diagram example of the proposed photonic chip of the invention, wherein the zoom shows a detail of the Programmable Photonic Analog Block as it pertains to the left-up to right-bottom direction of propagation.
Figure 2:
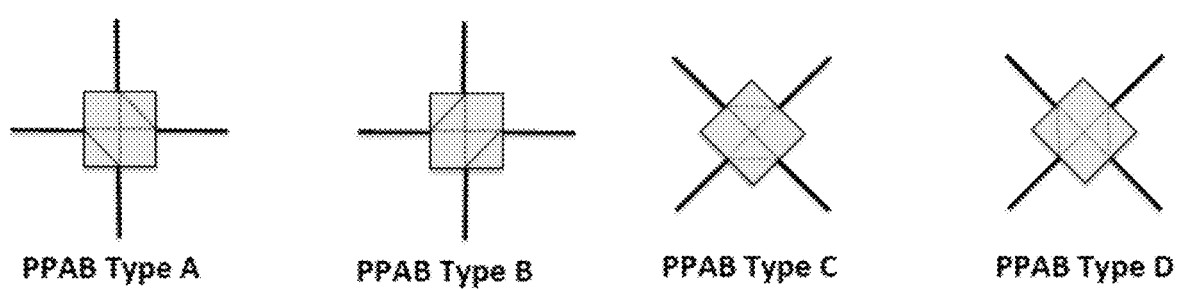
FIG. 2 shows four types of preferred 2×2 PPAB blocks and their internal signal coupling layouts shown in broken lines of the device of the present invention.

In a preferred embodiment of the object of the invention, a device is provided as shown in FIG. 1 where a field-programmable photonic array (FPPA) is seen which comprises at least one, but preferably a number of programmable photonic analogue blocks (PPABs) and at least one reconfigurable photonic interconnection (RPI) implemented by way of a series of photonic waveguide elements developed on a photonic chip substrate. The waveguide elements composing the RPIs also have programmable characteristics and can propagate the light in both directions. Take into account that the design in FIG. 1 does not assume any particular waveguide array geometry and that the square design shown there is only for the purposes of illustration. Although various configurations for the PPBA may be considered, here we are illustrating the design with a very basic 2×2 (2 input ports/2 output ports PPBA units). The scheme of said PPAB is shown in the square of FIG. 1 for a particular axis orientation and without internal coupling routes. In general, we will consider different options, all of which can be obtained from A (see for example a particular example where B, C, D are obtained from a rotation), wherein a first input port is aligned with a longitudinal direction and a second input port is aligned with a transversal direction, and wherein a first output port is aligned with the longitudinal direction and a second input port is aligned with the transversal direction, by means of conventional rotations (B is A rotated 90°, C is A rotated 45° and D is A rotated)−45°. FIG. 2 shows the possible options. The function of the PPAB is to provide independent power coupling relations and adjustable phase adjustments, as explained below.

Figure 3:
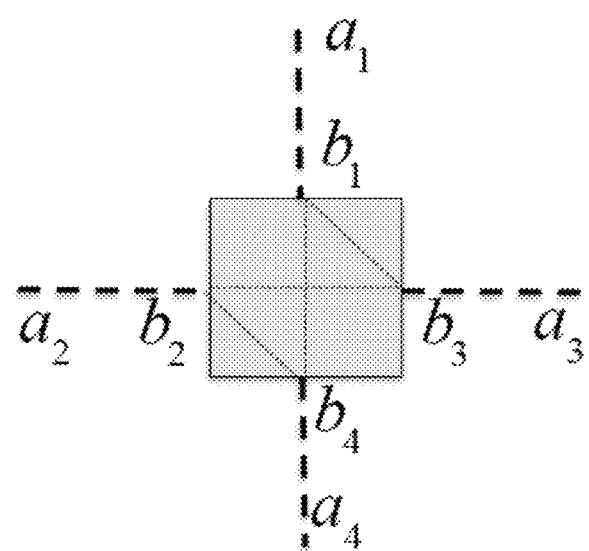
FIG. 3 shows a type A PPAB block including the internal and external optical fields at its ports of the device of the present invention.

The independent operation of the PPAB is illustrated in FIG. 3 for the type A case (the description for the other types follows the same line of reasoning). FIG. 3 shows the design of the type A PPBA with an indication of the optical fields in the input and output ports Opt b2, b3, b4) and also the external fields in the input/output RPI elements that enclosure the PPAB (a1, a2, a3, a4).

The PPAB is a 2×2 photonic component capable of independently configuring a common tunable phase shift $\Delta_{PPAB}$ and tunable optical power splitting ratio $K=\sin\theta$ ($0<=K<=1$) between its optical waveguide input fields and its output optical waveguide output fields. Two propagation directions are possible; the first is from the left and top ports to the right and bottom ports and is characterized by any of the two following transmission arrays:

$$\begin{pmatrix} b_3 \\ b_4 \end{pmatrix} = e^{j(\Delta_{PPAB}\sigma_o + \theta\sigma_1)}\begin{pmatrix} b_1 \\ b_2 \end{pmatrix} = e^{j\Delta_{PPAB}}\begin{pmatrix} \cos\theta & j\sin\theta \\ j\sin\theta & \cos\theta \end{pmatrix}\begin{pmatrix} b_1 \\ b_2 \end{pmatrix} \quad (1)$$

$$\begin{pmatrix} b_3 \\ b_4 \end{pmatrix} = e^{j(\Delta_{PPAB}\sigma_o + \theta\sigma_2)}\begin{pmatrix} b_1 \\ b_2 \end{pmatrix} = e^{j\Delta_{PPAB}}\begin{pmatrix} \cos\theta & \sin\theta \\ -\sin\theta & \cos\theta \end{pmatrix}\begin{pmatrix} b_1 \\ b_2 \end{pmatrix}$$

Where $\sigma_0$, $\sigma_1$, and $\sigma_2$ represent the zero, first and second Pauli matrices. Both can be changed by means of two external control signals (electronic, mechanic, acoustic) by way of a linear relationship. The second is from the right and bottom ports to the left and top ports and is characterized by the following transmission array:

$$\begin{pmatrix} b_1 \\ b_2 \end{pmatrix} = e^{j(\Delta_{PPAB}\sigma_o + \theta\sigma_1)}\begin{pmatrix} b_3 \\ b_4 \end{pmatrix} = e^{j\Delta_{PPAB}}\begin{pmatrix} \cos\theta & j\sin\theta \\ j\sin\theta & \cos\theta \end{pmatrix}\begin{pmatrix} b_3 \\ b_4 \end{pmatrix} \quad (2)$$

$$\begin{pmatrix} b_1 \\ b_2 \end{pmatrix} = e^{j(\Delta_{PPAB}\sigma_o + \theta\sigma_2)}\begin{pmatrix} b_3 \\ b_4 \end{pmatrix} = e^{j\Delta_{PPAB}}\begin{pmatrix} \cos\theta & \sin\theta \\ -\sin\theta & \cos\theta \end{pmatrix}\begin{pmatrix} b_3 \\ b_4 \end{pmatrix}.$$

Figure 4:
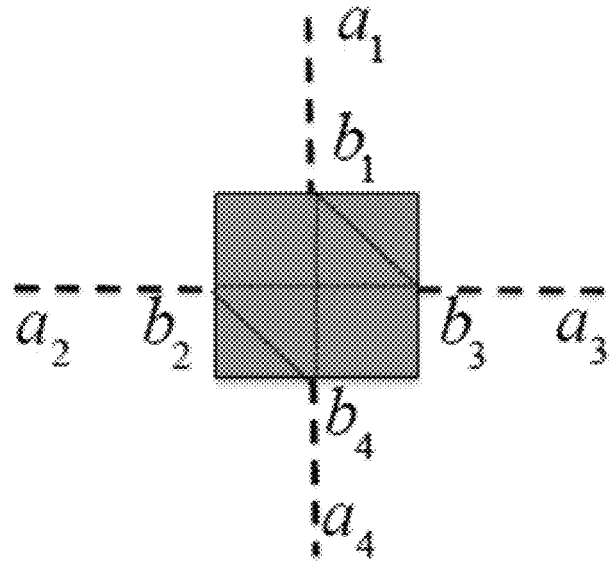
FIG. 4 shows some non-limitative examples of simple programming of the at least one programmable photonic analogue block (PPAB), and the at least one reconfigurable photonic interconnection (RPI) leading to very basic operations required in photonic signal processing.
Figure 4:
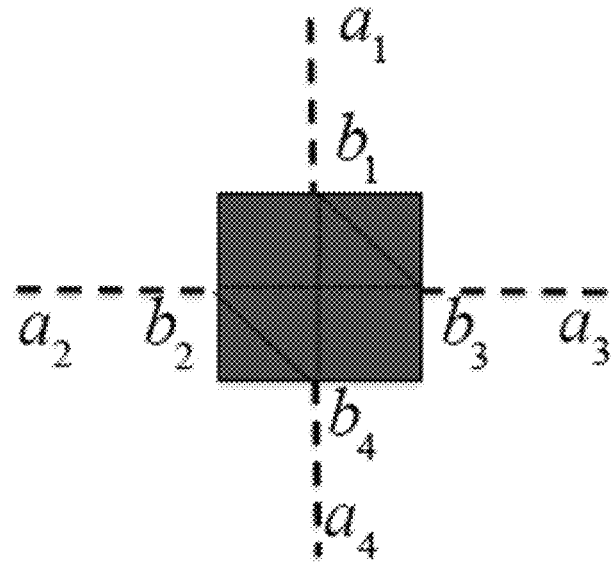

FIG. 4 shows some examples of the simple programming of the RPI+PPAB which leads to very basic operations required in the processing of photonic signals. Many more are possible.

Once again, modes of operation and similar color codes can be defined for PPAB of the B, C and D type.

Figure 5:
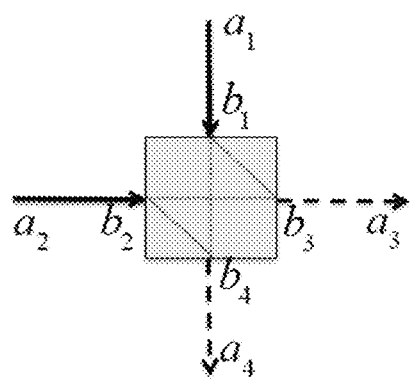
FIG. 5 shows an illustration of the combined effect of two access RPI phase shifting elements one reconfigurable photonic interconnection (RPI) and a Type A PPBA for Left and Up ports to Right and Down ports propagation direction (Left: PRI preceding the PPAB. Right: PPAB succeeding the PPAB).
Figure 5:
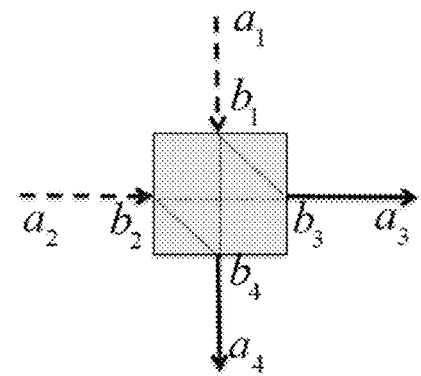

It is assumed that the RPI elements provide a lossless tunable phase change and its combination with the PPAB elements provides an extra degree of flexibility in the 2×2 transmission array. FIG. 5 shows this characteristic for a type A PPBA element below the propagation direction of the left and top ports to the right and bottom (a similar procedure can be established for the inverse propagation direction and for the types B, C and D of the PPBA).

The RPI elements of the optical waveguide can provide an independent and tunable differential phase shifting Ø over a common value $\Delta_{RPI}$ to the two input and/or output waveguides which access the PPAB. For example, and referring to the left part of FIG. 5:

$$\boxed{?}\begin{pmatrix} b_1 \\ b_2 \end{pmatrix} = e^{j[(\Delta_{RPI} + \frac{\phi}{2})\sigma_o + \frac{\phi}{2}\sigma_3]}\begin{pmatrix} a_1 \\ a_2 \end{pmatrix} = e^{j\Delta_{RPI}}\begin{pmatrix} e^{j\phi} & 0 \\ 0 & 1 \end{pmatrix}\begin{pmatrix} a_1 \\ a_2 \end{pmatrix} \quad (3)$$

Where $\sigma_3$ represents the third Pauli matrix. The combined action of a PPAB element and its preceding RPI element can be converted at least in the two following manners:

$$\binom{b_3}{b_4} = e^{j(\Delta_{PPAB}\sigma_o + \phi\sigma_1)}e^{j[(\Delta_{RPI} + \frac{\phi}{2})\sigma_o + \frac{\phi}{2}\sigma_3]}\binom{a_1}{a_2} = \quad (4)$$

$$e^{j\Delta}\begin{pmatrix}\cos\theta & j\sin\theta \\ j\sin\theta & \cos\theta\end{pmatrix}\begin{pmatrix}e^{j\phi} & 0 \\ 0 & 1\end{pmatrix}\binom{a_1}{a_2} == e^{j\Delta}\begin{pmatrix}e^{j\phi}\cos\theta & j\sin\theta \\ je^{j\phi}\sin\theta & \cos\theta\end{pmatrix}\binom{a_1}{a_2}$$

$$\binom{b_3}{b_4} = e^{j(\Delta_{PPAB}\sigma_o + \phi\sigma_2)}e^{j[(\Delta_{RPI} + \frac{\phi}{2})\sigma_o + \frac{\phi}{2}\sigma_3]}\binom{a_1}{a_2} =$$

$$e^{j\Delta}\begin{pmatrix}\cos\theta & \sin\theta \\ -\sin\theta & \cos\theta\end{pmatrix}\begin{pmatrix}e^{j\phi} & 0 \\ 0 & 1\end{pmatrix}\binom{a_1}{a_2} == _{[?]}e^{j\Delta}\begin{pmatrix}e^{j\phi}\cos\theta & \sin\theta \\ -e^{j\phi}\sin\theta & \cos\theta\end{pmatrix}\binom{a_1}{a_2}$$

Where the common phase factor is given by $\Delta = \Delta_{RPI} + \Delta_{PPAB}$.

Similarly, the combined action of a PPAB element and its succeeding RPI element (which is shown in the right part of FIG. 5) is given by:

$$\binom{b_3}{b_4} = e^{j[(\Delta_{RPI} + \frac{\phi}{2})\sigma_o + \frac{\phi}{2}\sigma_3]}e^{j(\Delta_{PPAB}\sigma_o + \phi\sigma_1)}\binom{a_1}{a_2} = \quad (5)$$

$$e^{j\Delta}\begin{pmatrix}e^{j\phi} & 0 \\ 0 & 1\end{pmatrix}\begin{pmatrix}\cos\theta & j\sin\theta \\ j\sin\theta & \cos\theta\end{pmatrix}\binom{a_1}{a_2} == e^{j\Delta}\begin{pmatrix}e^{j\phi}\cos\theta & je^{j\phi}\sin\theta \\ j\sin\theta & \cos\theta\end{pmatrix}\binom{a_1}{a_2}$$

$$\binom{b_3}{b_4} = e^{j[(\Delta_{RPI} + \frac{\phi}{2})\sigma_o + \frac{\phi}{2}\sigma_3]}e^{j(\Delta_{PPAB}\sigma_o + \phi\sigma_2)}\binom{a_1}{a_2} =$$

$$e^{j\Delta}\begin{pmatrix}e^{j\phi} & 0 \\ 0 & 1\end{pmatrix}\begin{pmatrix}\cos\theta & \sin\theta \\ -\sin\theta & \cos\theta\end{pmatrix}\binom{a_1}{a_2} ==$$

$$_{[?]}e^{j\Delta}\begin{pmatrix}e^{j\phi}\cos\theta & e^{j\phi}\sin\theta \\ -\sin\theta & \cos\theta\end{pmatrix}\binom{a_1}{a_2}$$

By means of suitable programming and the concatenation of successive RPI+PPAB and/or PPAB+RPI units, the FPPA can implement complex autonomous and/or parallel photonic circuits and signal processing transformations by discretizing conventional optical processing circuits into RPI and PPAB units.

Figure 6:
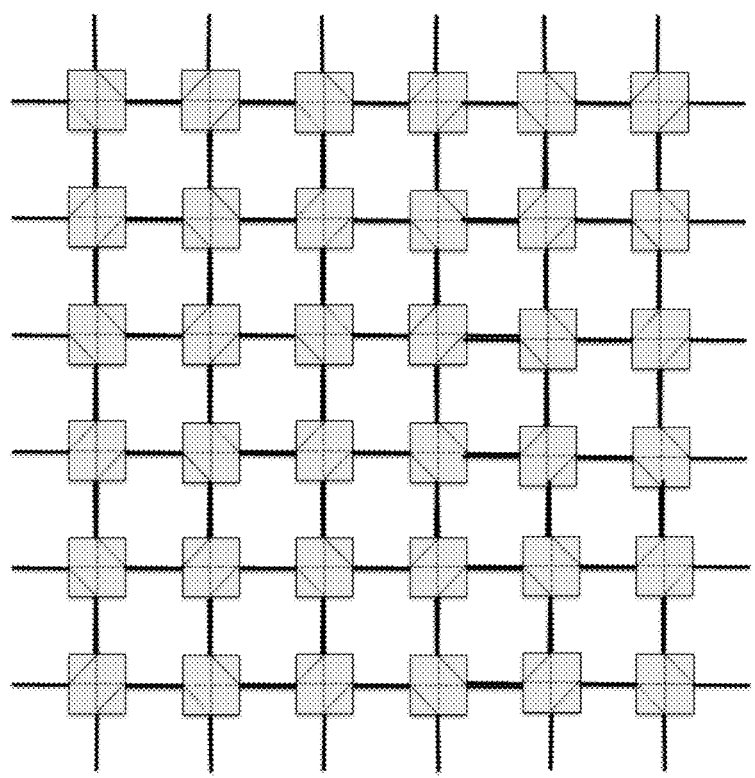
FIG. 6 shows the layout of a first design related to a square type uniform photonic chip design, wherein type A and type B PPAB elements are interleaved in every column and row of the device, denoting this design as ABABAB.
Figure 7:
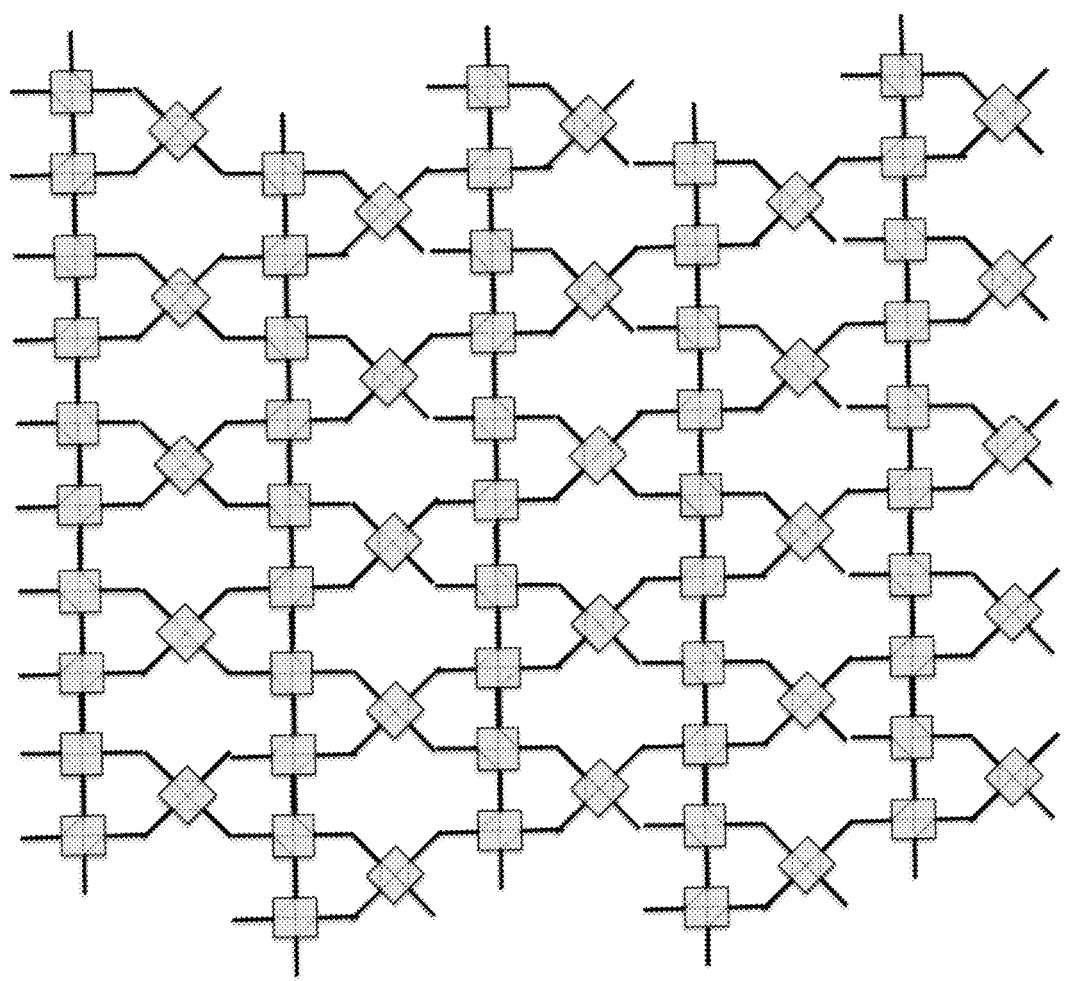
FIG. 7 shows a second design where columns of interleaved type A and type B PPABs are interleaved with columns formed by Type C PPABs, denoting this design as ABCCAB.
Figure 8:
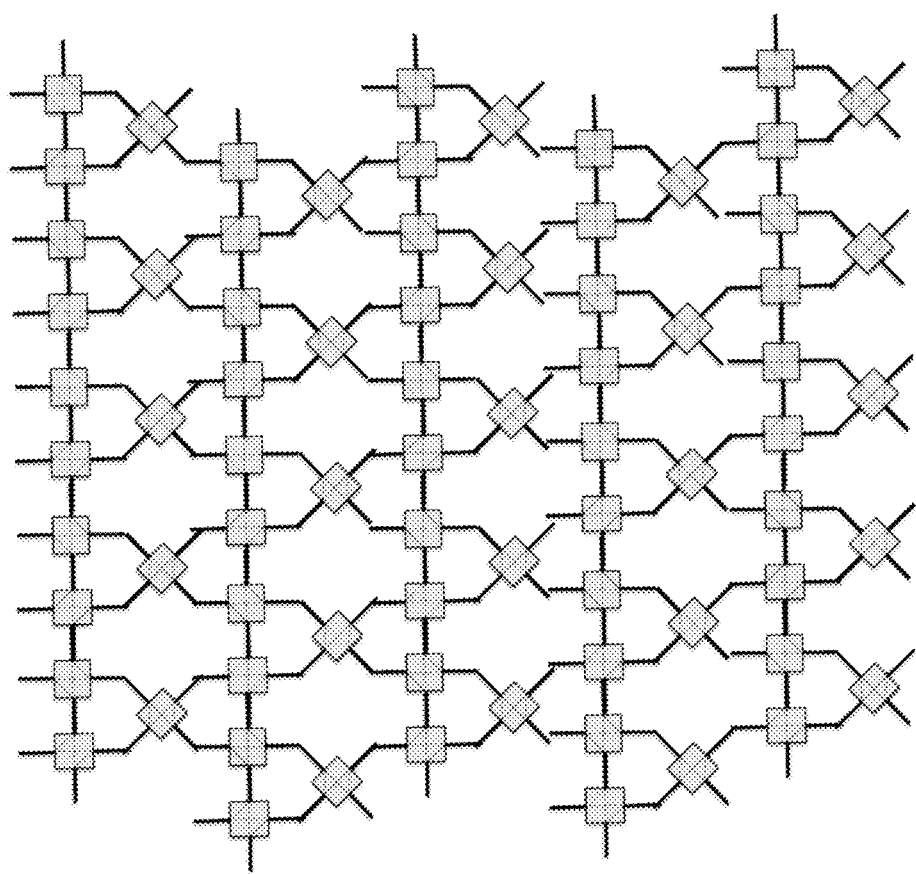
FIG. 8 shows a third design example where columns of interleaved type A and type B PPABs are interleaved with columns formed by Type D PPABs, denoting this design as ABDDAB.

In particular, this concept is illustrated by means of three generic designs which are represented in FIGS. 6, 7 and 8, respectively.

The field-programmable photonic array (FPPA) according to the invention is an array of uncommitted elements that can be interconnected according to a user's specifications configured for a wide variety of applications. An FPPA combines the programmability of the most basic reconfigurable photonic integrated circuits in a scalable interconnection structure, allowing programmable circuits with much higher processing density. Thus, processing complexity comes from the interconnectivity.

Figure 9:
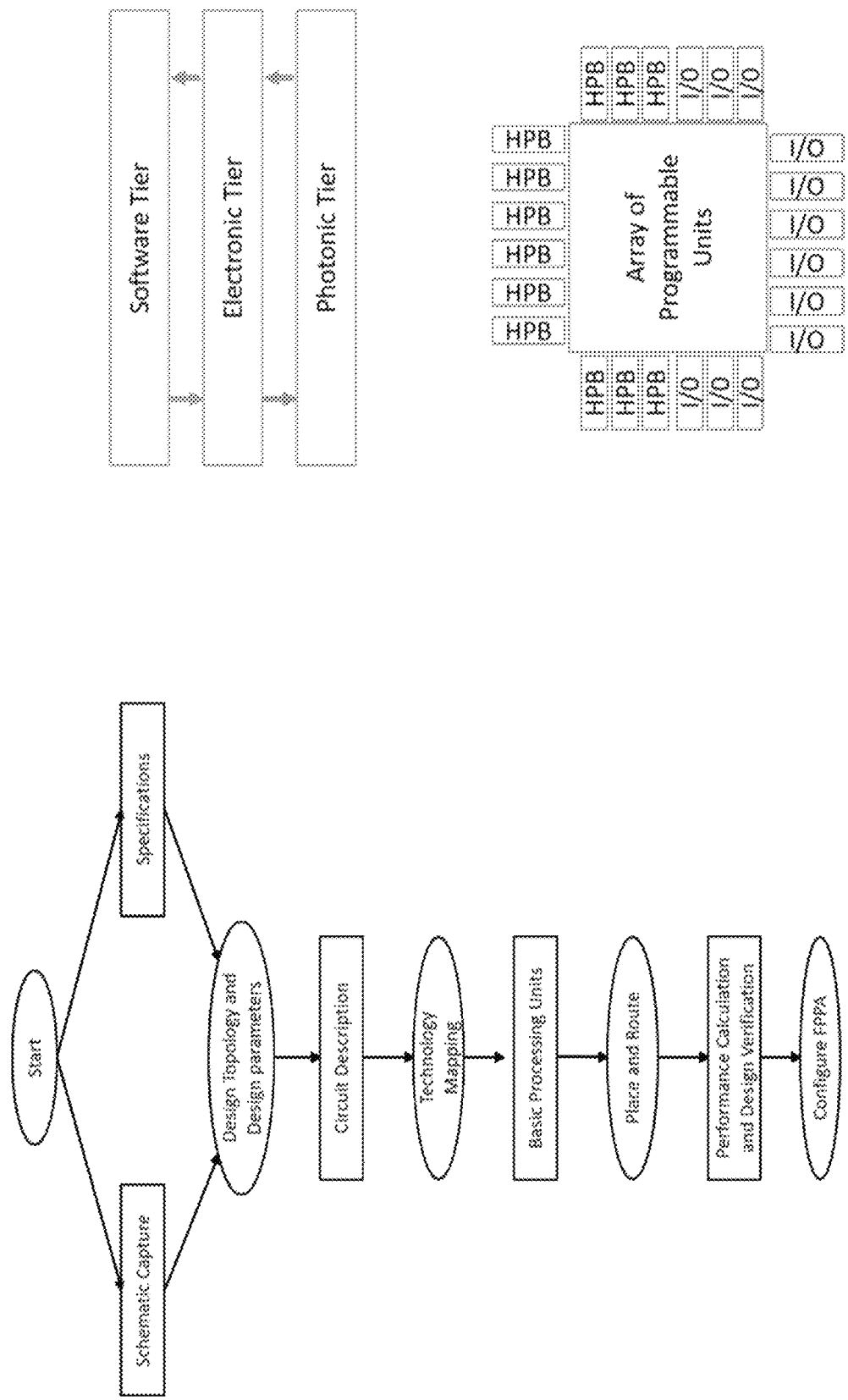
FIG. 9 shows on the left-hand, the main steps involved in the design/configuration flow of a photonic chip of the present invention and on the right-hand, the soft and hard tiers of the photonic chip and the expanded layout including peripheral high-performance blocks

The left part of FIG. 9 shows the main steps of the design flow process, which are now described. The starting point for the design flow is the initial application entry to be implemented. The specifications are then processed by an optimization process to enhance the area and performance of the final circuit. Then, specifications are transformed into a compatible circuit of FPPA processing blocks (technology mapping), optimizing attributes such as delay, performance or number of blocks.

Technology mapping phase transforms the optimized network into a circuit that consists of a restricted set of circuit elements (FPPA processing blocks). This is done by selecting pieces of the network that can each be implemented by one of the available basic circuit elements, and specifying how these elements are to be interconnected. This will determine the total number of processing blocks required for the targeted implementation.

Then, a decision about the placement follows, assigning each processing block to a specific location in the FPPA. At that moment, the global routing is done by choosing the processing units that will perform as access lightpaths. In contrast to FPGA, this structure does not physically differentiate between processing blocks and Interconnection resources. Formerly, the processing block configurations are chosen correspondingly and performance calculation and design verification is carried out. It can be done either physically by feeding all the necessary configuration data to the programming units to configure the final chip or by employing accurate models of the FPPA. At each step it is possible to run an optimization process that might decide to re-configure any of the previous steps.

From the aforementioned description it can be appreciated that the FPPA involves not only the physical hardware of the photonic and control electronic tier but also it is composed of a software layer (see upper right part of FIG. 9).

The steps contained in the generic design flow can be done automatically by the software layer, by the user, or a mixture of the two, depending on the autonomy and the capabilities of the FPPA. In addition, a failure in any of the steps will require an iterative process till the specifications are accomplished successfully. Additional parallel optimization process (mainly self-winding), enable robust operation, self-healing attributes and additional processing power to the physical device.

Similarly to modern FPGA families, FPPA can include peripheral and internal high-performance blocks (HPB) to expand its capabilities to include higher level functionality fixed into the chip. This is shown schematically in the lower right part of FIG. 9. Having these common functions embedded into the chip reduces the area required and gives those functions increased performance compared to building them from primitives. Moreover, some of them are impossible to be obtained by a discretized version of basic processing blocks. Examples of these include high-dispersive elements, spiral waveguide delay lines, generic modulation and photo detection subsystems, optical amplifiers and source subsystems and high-performance filtering structures to cite a few.

Figure 14:
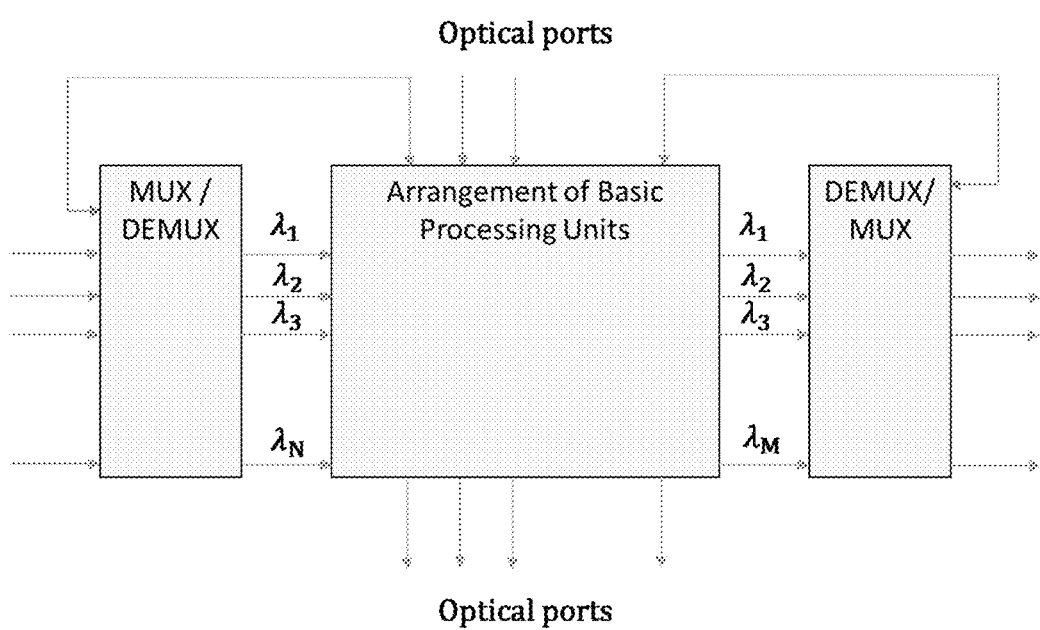
FIG. 14 shows an FPPA implementation with high-performance building blocks providing wavelength multiplexing and demultiplexing tasks. The arrangement of basic processing units can be coupled to this block enabling the processing in different channels and different wavelengths.

A special case of HPB is an interconnection of the arrangement of basic processing units with input/output wavelength multiplexing/demultiplexing devices, either of which can be spectrally cyclic, or non-cyclic. As illustrated in FIG. 14, it introduces another degree of flexibility, allowing the processing of multiple wavelengths. Here we see that the system enables the processing on different spatial channels/modes as well as different frequency channels/modes.

Operation Examples

Figure 10:
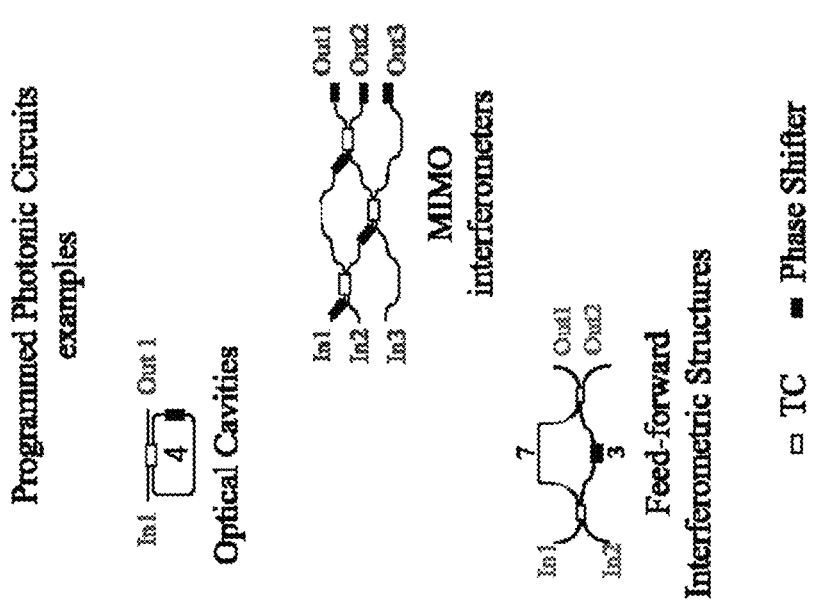
FIG. 10 shows a simultaneous implementation of a Ring cavity, a Mach-Zehnder Interferometer and a 3×3 multiple port interferometer using a design ABABAB of the photonic chip of the present invention.
Figure 10:
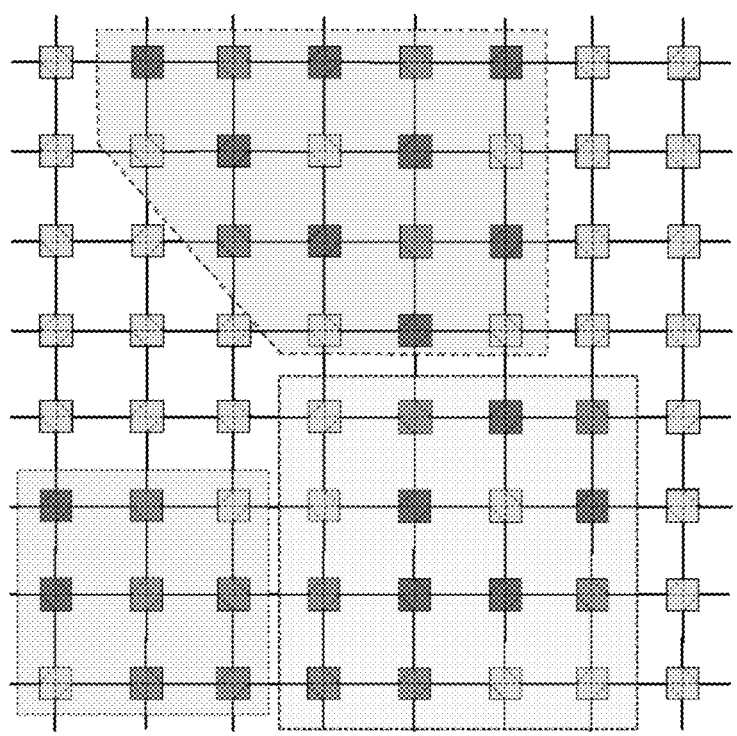
Figure 11:
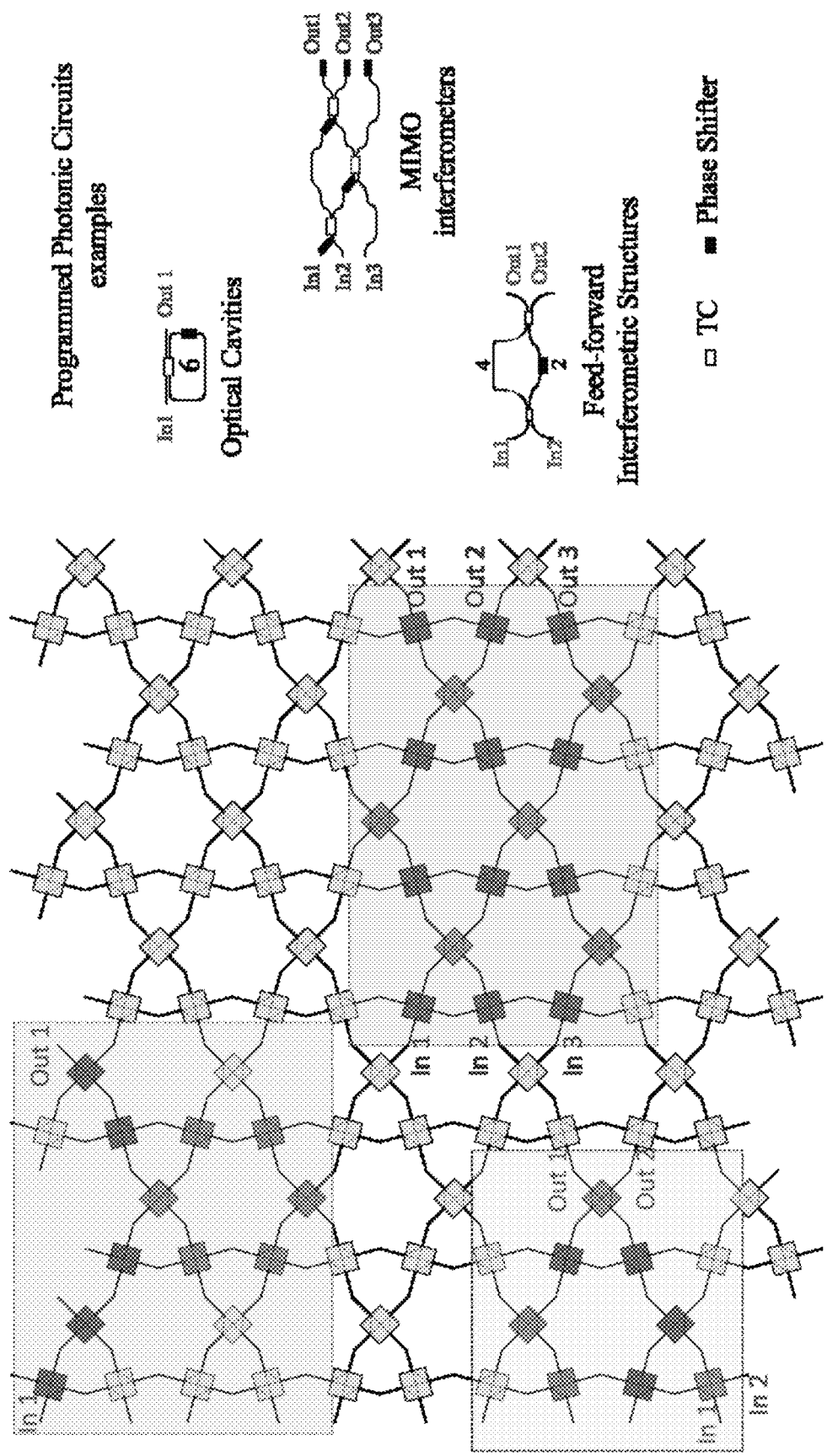
FIG. 11 shows a simultaneous implementation of a Ring cavity, a Mach-Zehnder Interferometer and a 3×3 multiple port interferometer using a design ABCCAB of the photonic chip of the present invention.
Figure 12:
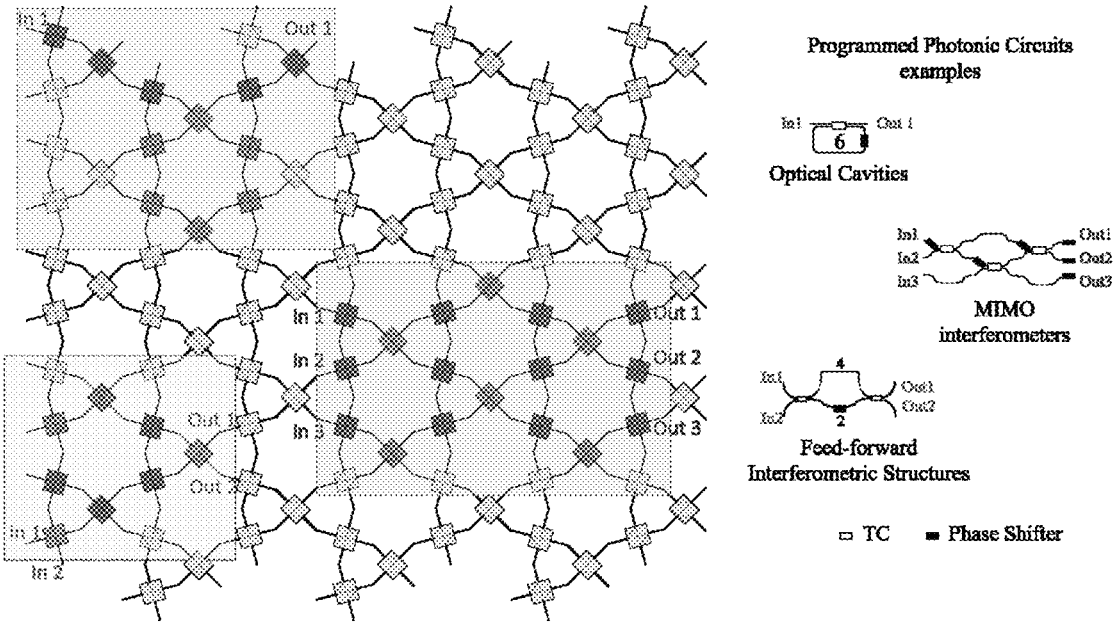
FIG. 12 shows a simultaneous implementation of a Ring cavity, a Mach-Zehnder Interferometer and a 3×3 multiple port interferometer using a design ABDDAB of the photonic chip of the present invention.

FIGS. 10, 11 and 12 provide some examples where FPPAs of different types are programmed to emulate and implement simultaneously different photonic circuits. In each case the figure includes the FFPA layout with colored PPBAs according to the code defined earlier and the layouts of the implemented circuits.

Physical Implementation

Figure 13:
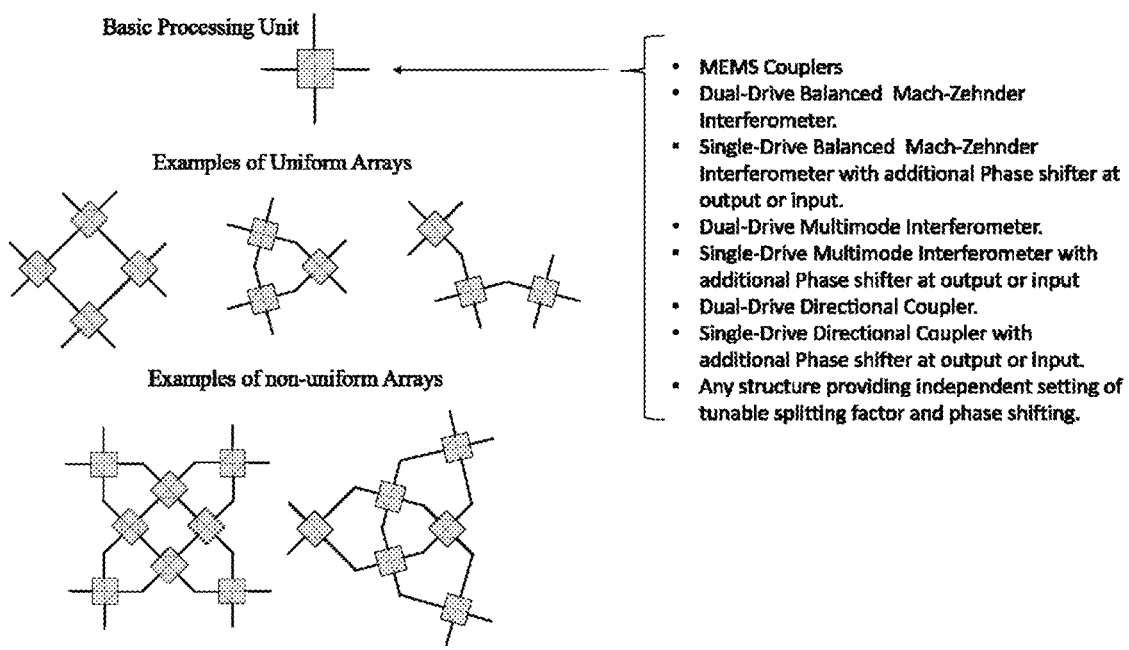
FIG. 13 shows several technology options for the implementation of the PPAB elements (upper), several field-programmable photonic array (FPPA) layouts (intermediate) and others FPPAs possible configurations (lower).

The physical implementation of the FPPA device calls for an integrated optics approach either based on silicon photonics platform or a hybrid/heterogeneous III-V and Silicon photonics platforms. FIG. 13 provides some information about the physical options available.

As for the PPAB elements, the currently available photonics technology options are listed in the upper part of FIG. 13. Regarding the implementation of ABABAB, ABCCAB and ABDDAB FPPA layouts, the intermediate part of FIG. 13 shows the basic replicating blocks. These correspond to the unit blocks of square, hexagonal and triangular waveguide meshes so these are natural and compact option for implementation. Finally, as mentioned before, more complex FPPA layouts can be designed by interleaving the proposed types of PPBAs, some examples are shown in the lower part of FIG. 13.

The invention claimed is:

1. A photonic chip comprising the following, implemented via a photonic chip:
   a) at least one programmable photonic analogue block with no resonant elements interconnected to a plurality of programmable building blocks to provide feedback propagation within each of the plurality of programmable building blocks; and
   b) at least one reconfigurable photonic interconnection with no resonant elements, able to be interconnected to provide the feedback propagation within the plurality of programmable building blocks, wherein the at least one reconfigurable photonic interconnection is configured to interconnect adjacent programmable photonic analogue blocks with no resonant elements between said adjacent programmable photonic analogue blocks.

2. The photonic chip of claim 1, wherein the at least one reconfigurable photonic interconnection comprises at least two photonic waveguide elements.

3. The photonic chip of claim 2, wherein the photonic waveguide element is configured to allow propagation in both directions.

4. The photonic chip of claim 2, wherein the photonic waveguide element is configured to be programmable to set the lightpath in an arrangement.

5. The photonic chip of claim 2, wherein the at least one reconfigurable photonic interconnection is configured to provide an independent and tunable differential phase shifting Ø over a common value $\Delta_{RPI}$ to two optical waveguide input fields of the at least two photonic waveguide elements according to the following transmission array:

$$\begin{pmatrix} b_1 \\ b_2 \end{pmatrix} = \begin{pmatrix} e^{j(\phi+\Delta_{RPI})} & 0 \\ 0 & e^{j\Delta_{RPI}} \end{pmatrix} \begin{pmatrix} a_1 \\ a_2 \end{pmatrix} = e^{j\Delta_{RPI}} \begin{pmatrix} e^{j\phi} & 0 \\ 0 & 1 \end{pmatrix} \begin{pmatrix} a_1 \\ a_2 \end{pmatrix}.$$

6. The photonic chip of claim 1, wherein the at least one programmable photonic analogue block comprises at least two input ports and two output ports described by a unitary 2×2 rotation matrix of a special unitary group of degree 2, comprising four components, with different phase relationships among its four components;
   wherein the unitary 2×2 rotation matrix is concatenable in several dispositions to yield any arbitrary 2×2 unitary matrix.

7. The photonic chip of claim 6, further comprising a tunable coupler with phase shifting capabilities, in such a way that the at least one programmable photonic analogue block is capable of independently configuring an arbitrary splitting ratio K (0<=K<=1) and a common phase shift $\Delta_{PPAB}$ between a least one input port and two output ports.

8. The photonic chip of claim 1, wherein the at least one programmable photonic analogue block and the at least one reconfigurable photonic interconnection are configured to be implemented by way of a series of photonic waveguide elements developed on a photonic chip substrate.

9. A field programmable photonic array comprising at least two photonic chips according to claim 1.

10. A photonic integrated circuit comprising programmable tunable couplers for the interconnection of at least two programmable photonic chips as defined in claim 9 that use the programmable tunable couplers as their primitive element to configure interferometric structures.

11. The photonic integrated circuit of claim 10 wherein the programmable tunable couplers are interconnectable in such a way that allows a configuration of optical cavities and feed-forward and feedbackward interferometric structures using the tunable couplers with additional phase configuration as their primitive element.

12. The photonic integrated circuit of claim 11, wherein the field programmable photonic array is interconnected to high-performance building blocks configured to perform basic optical processing tasks as: optical amplification, optical sources, electro-optical modulation, opto-electronic photodetection, optical absorption and delay line arrays, optical wavelength and polarization (de)multiplexing, optical routing.

13. The photonic integrated circuit of claim 11, wherein the field programmable photonic array is interconnected to high-performance building blocks configured to performs wavelength multiplexing/demultiplexing of light either in a spectral cyclic or non-cyclic way.

14. The photonic integrated circuit of claim 10, comprising the programmable photonic analogue blocks and the at least one reconfigurable photonic interconnection implemented by a non-resonant interferometer of type Mach-Zehnder.

15. The photonic integrated circuit of claim 10, comprising the programmable photonic analogue blocks and the at least one reconfigurable photonic interconnection implemented by a non-resonant interferometer of type Mach-Zehnder with two arms of equal length.

16. The photonic integrated circuit of claim 10, comprising the programmable photonic analogue blocks and the at least one reconfigurable photonic interconnection implemented by a non-resonant dual-drive directional coupler.

17. The photonic integrated circuit of claim 10, wherein the programmable photonic analogue blocks and the at least one reconfigurable photonic interconnection comprise a plurality of phase and amplitude tuners that are based on: MEMS, thermo-optic effects, electro-optic effects, opto-mechanics, or electro-capacitive effects.

18. The photonic integrated circuit of claim 10, wherein the programmable photonic analogue blocks and the at least one reconfigurable photonic interconnection define waveguide mesh arrangements that are distributed in a uniform topology.

19. The photonic integrated circuit of claim 10, wherein the programmable photonic analogue blocks and the at least one reconfigurable photonic interconnection define waveguide mesh arrangements that are distributed in a non-uniform topology.

* * * * *